(12) United States Patent  (10) Patent No.: US 7,084,631 B2
Qu et al.                  (45) Date of Patent:     Aug. 1, 2006

(54) MAGNETIC RESONANCE IMAGING ARRAY COIL SYSTEM AND METHOD FOR BREAST IMAGING

(75) Inventors: Kun Qu, Aurora, OH (US); Pei H. Chan, Aurora, OH (US); Tsinghua Zheng, Aurora, OH (US); Joseph Murphy-Boesch, Aurora, OH (US); Labros S. Petropoulos, Burton, OH (US)

(73) Assignee: General Electric Company, Schenectady, NY (US)

( * ) Notice: Subject to any disclaimer, the term of this patent is extended or adjusted under 35 U.S.C. 154(b) by 26 days.

(21) Appl. No.: 10/846,783

(22) Filed: May 14, 2004

(65) Prior Publication Data

US 2005/0104591 A1     May 19, 2005

Related U.S. Application Data

(60) Provisional application No. 60/523,456, filed on Nov. 19, 2003.

(51) Int. Cl.
    *G01V 3/00*  (2006.01)
(52) U.S. Cl. ..................................... 324/318
(58) Field of Classification Search ............. 324/307, 324/309, 318; 600/410, 422; 333/219–235
    See application file for complete search history.

(56) References Cited

U.S. PATENT DOCUMENTS

| 5,602,557 A | * | 2/1997 | Duerr .................... 343/742 |
| 5,699,802 A | * | 12/1997 | Duerr .................... 600/422 |
| 6,023,166 A | * | 2/2000 | Eydelman ............... 324/318 |
| 6,163,717 A | * | 12/2000 | Su ......................... 600/422 |
| 6,377,836 B1 | * | 4/2002 | Arakawa et al. ........ 600/422 |
| 6,493,572 B1 | * | 12/2002 | Su et al. ................. 600/422 |
| 6,850,065 B1 | * | 2/2005 | Fujita et al. ............ 324/318 |
| 2004/0000907 A1 | * | 1/2004 | Ahluwalia et al. ...... 324/309 |

* cited by examiner

*Primary Examiner*—Diego Gutierrez
*Assistant Examiner*—Dixomara Vargas
(74) *Attorney, Agent, or Firm*—The Small Patent Law Group LLP; Dean D. Small

(57) ABSTRACT

A magnetic resonance imaging (MRI) array coil system and method for breast imaging are provided. The MRI array coil system includes a top coil portion with two openings configured to receive therethrough objects to be imaged. The MRI array coil system further includes a bottom coil portion having two openings configured to access from sides of the bottom coil portion the objects to be imaged. The top coil portion and bottom coil portion each have a plurality of coil elements configured to provide parallel imaging.

30 Claims, 17 Drawing Sheets

MAGNETIC RESONANCE IMAGING ARRAY COIL SYSTEM AND METHOD FOR BREAST IMAGING

CROSS REFERENCE TO RELATED APPLICATIONS

This application claims priority to and the benefit of the filing date of U.S. Provisional Application No. 60/523,456 filed on Nov. 19, 2003 and which is hereby incorporated by reference in its entirety.

BACKGROUND OF THE INVENTION

This invention relates generally to Magnetic Resonance Imaging (MRI) systems, and more particularly, to Radio-Frequency (RF) coils in MRI systems.

In MRI, the RF receive coil is one of the most important hardware components in the imaging system. A special-purpose receive coil for a region of interest is typically used for reception to enhance the signal-to-noise ratio (SNR) at that region.

For RF receive coils, it is known to further increase SNR using quadrature reception. In quadrature reception, NMR signals are detected in two orthogonal directions, which are in the transverse plane or perpendicular to the main magnetic field. The two signals are detected by two independent individual coils that cover the same volume of interest. With quadrature reception, the SNR can be increased, for example, by up to $\sqrt{2}$ over that of the individual linear coils.

Known receive coils are designed to provide higher image SNR. Further, with the use of parallel imaging techniques, not only is higher image quality provided, but higher scan speeds are provided without corresponding reduction in SNR.

Sensitivity Encoding (SENSE) is one techniques for parallel imaging that uses multiple coils to scan faster. Using SENSE, spatial sensitivity information provided by each coil element of a multiple-coil array system is used to substitute for the information provided by the encoding gradient in the k-space, therefore saving scanning time. The aliased or wrapped images generated by omitting the k-space lines are reconstructed by spatial sensitivity information provided by coil elements. Systems having SENSE compatible coils typically include a number of coil elements, with each of the coil elements providing distinctive spatial sensitivity information.

SENSE imaging may be used in different imaging applications, for example, for breast MRI. Breast MRI provides, for example, higher sensitivity when compared to other modalities. Changing magnetic resonance techniques and updated clinical imaging protocols result in a need for RF coils for breast imaging that provide high-resolution images, provide fast scanning speed with the application of the SENSE technique, and facilitate image guided biopsy and needle localization. The SENSE technique can greatly reduce the scan time, but typically requires arrays of multiple receiver coils that surround the tissue of interest. Known coils dedicated to breast MRI have very limited SENSE capability, if any at all, limited coverage, reduced SNR, more complex designs or decoupling arrangements, and/or are configured having a closed coil geometry that is unable to provide or provides limited biopsy access. Thus, these known coil designs for breast imaging are often complex and do not provide adequate or sufficient openness of the coils to allow medial and lateral biopsy access.

BRIEF DESCRIPTION OF THE INVENTION

In one embodiment, an MRI array coil system is provided having a top coil portion with two openings configured to receive therethrough objects to be imaged. The MRI array coil system further includes a bottom coil portion having two openings configured to access from sides of the bottom coil portion the objects to be imaged. The top coil portion and bottom coil portion each have a plurality of coil elements configured to provide parallel imaging.

In another embodiment, a method for magnetic resonance imaging is provided and includes configuring openings in a top coil portion of a coil array to receive breasts therethrough. The method further includes providing at least one of lateral and medial access to the breasts through a bottom coil portion of the coil array. The top coil portion and bottom coil portion each have a plurality of coil elements configured to provide parallel imaging.

DETAILED DESCRIPTION OF THE INVENTION

Figure 1:
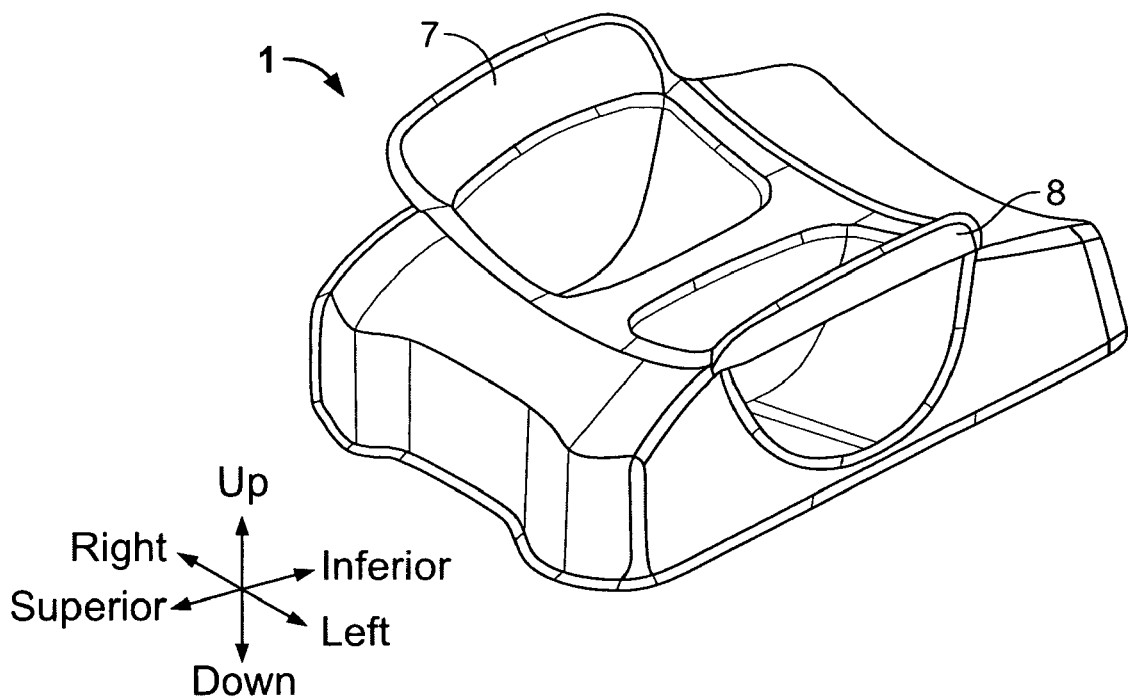
FIG. 1 is a perspective view of an MRI array coil system in accordance with an embodiment of the present invention.
Figure 2:
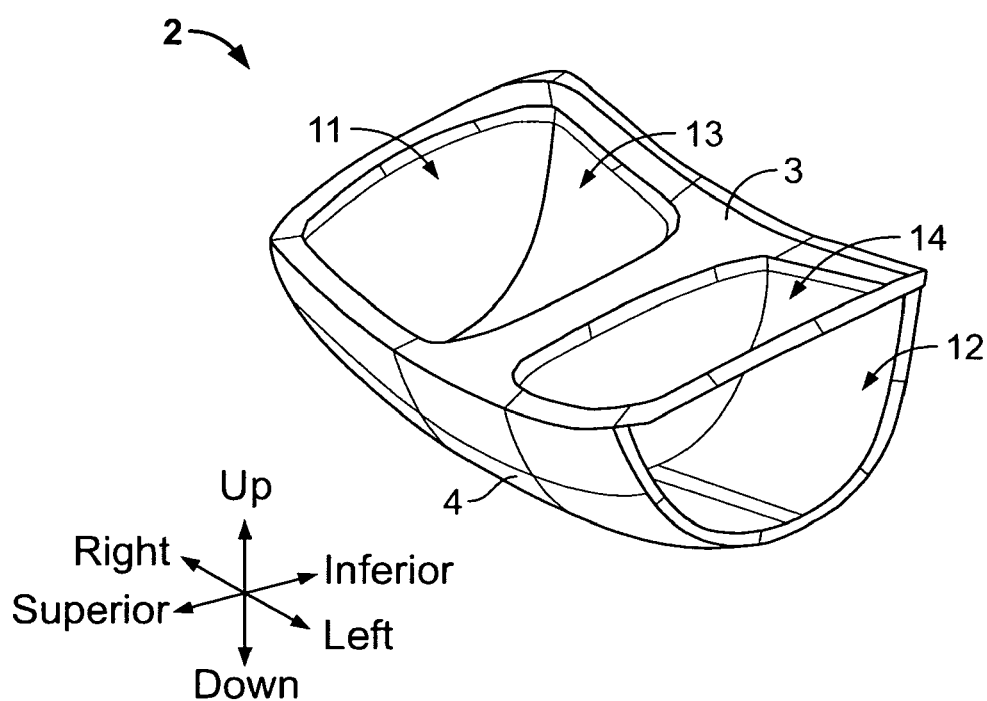
FIG. 2 is a perspective view of a main coil chamber of the MRI array coil system of FIG. 1.

FIG. 1 shows an MRI array coil system 1 constructed in accordance with one embodiment of the present invention. The MRI array coil system 1 generally includes a main coil chamber 2, a main bottom coil housing 6, a right wing 7 and a left wing 8. The main coil chamber 2, as shown in FIG. 2, is formed by a top coil portion, for example, a top coil plate 3 and a bottom coil portion, for example, a bottom coil former 4. The top coil plate 3 and the bottom coil former 4 are fixedly (e.g., permanently) connected in this embodiment. A right opening 13 and a left opening 14 are provided on the top coil plate 3 to receive the imaged objects (e.g., the left and right breasts of a human). The ends of the main coil chamber 2 also are open forming two windows 11 (right window) and 12 (left window), to allow access from both ends of the main coil chamber 2. Two wings 7 and 8 may be provided on rigid or semi-flexible formers that may be attached to the two ends of the top coil plate 3 as shown in FIG. 1.

Figure 3:
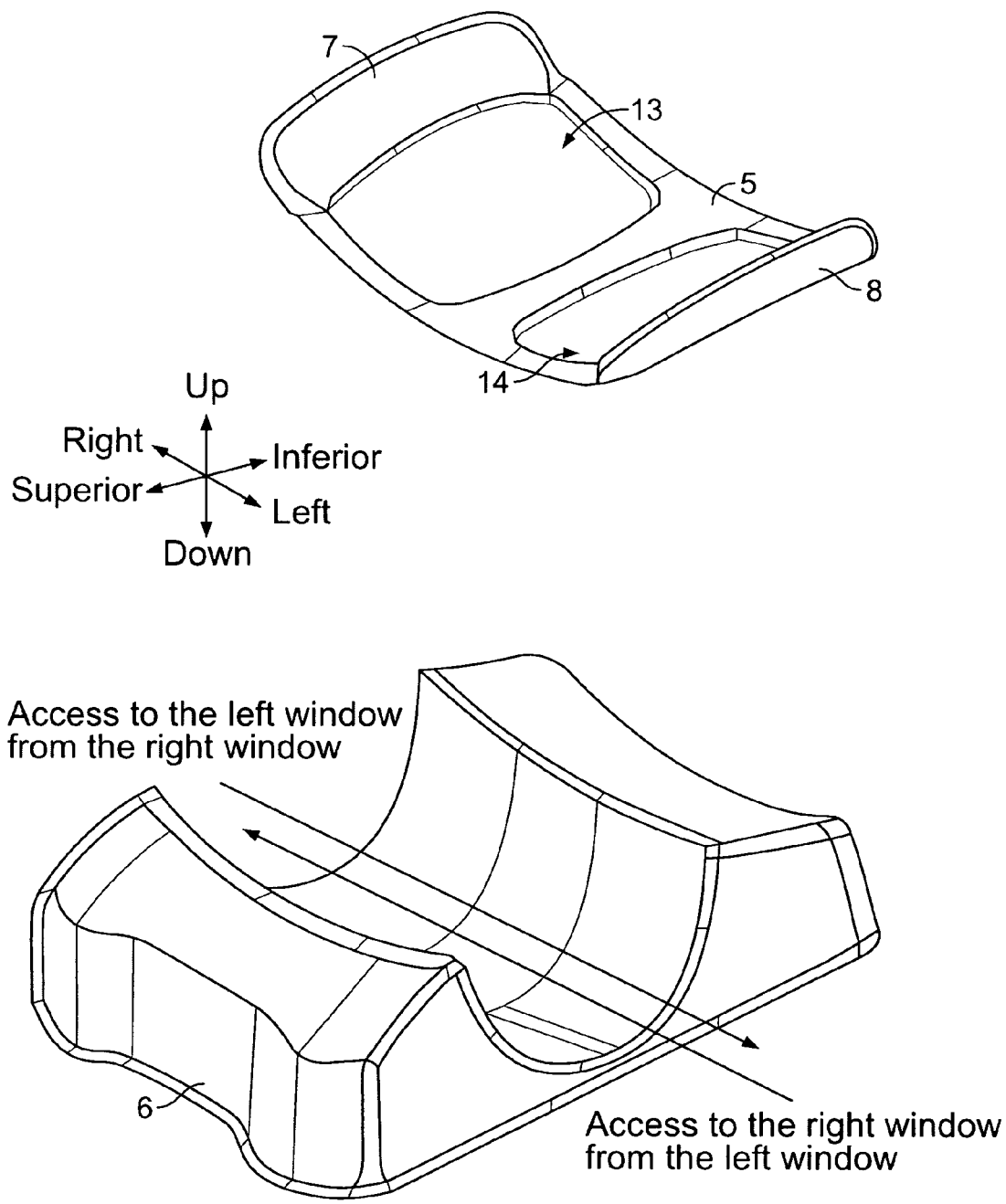
FIG. 3. is a perspective view of the MRI array coil system of FIG. 1 showing the main coil chamber detached.

In another embodiment, as shown in FIG. 3, the main coil chamber 2 may be formed by two separate pieces: a top coil portion, for example, a top coil former 5 and a bottom coil portion, for example, a bottom coil former 4 that may be removably connected together. It should be noted that the bottom coil former 4 may be fixedly or removably connected to the main bottom coil housing 6. The two ends of the top coil former 5 may be bent upward to form the two wings 7 and 8 or the two wings may be provided on two separate rigid or semi-flexible formers and may be attached to the two ends of the top coil plate 3 defined by a former. The left and right ends of the main coil chamber 2 are open forming the windows 11 (for the right end) and 12 (for the left end), to allow access from both ends of the main coil chamber 2 as illustrated in FIG. 3 by two arrows.

Figure 4:
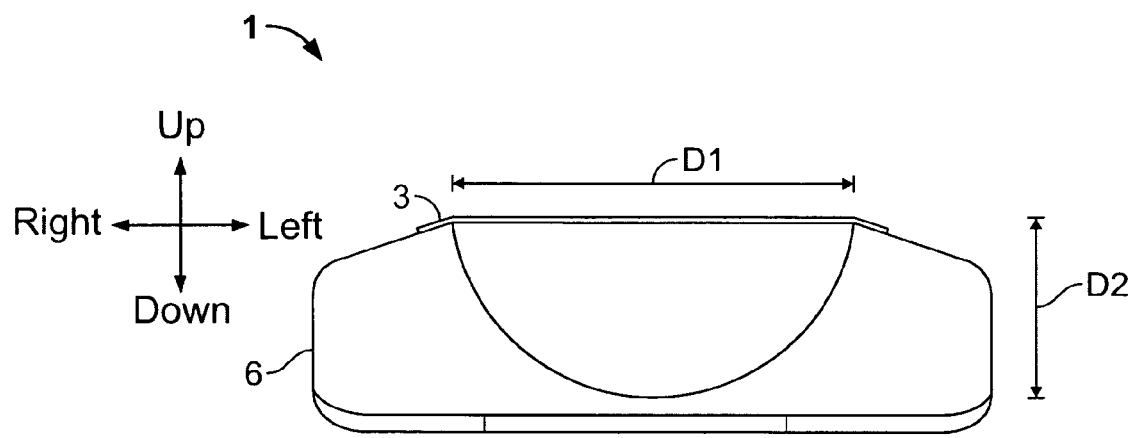
FIG. 4 is a side elevation view of the MRI array coil system of FIG. 1.
Figure 5:
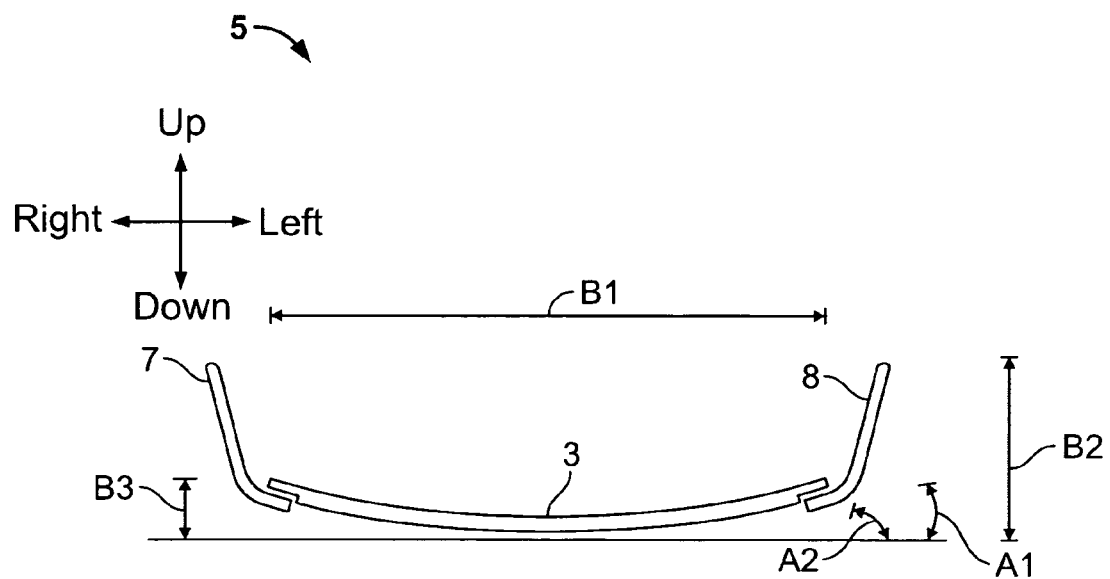
FIG. 5 is a front elevation view of a top coil portion of the MRI array coil system of FIG. 1.
Figure 6:
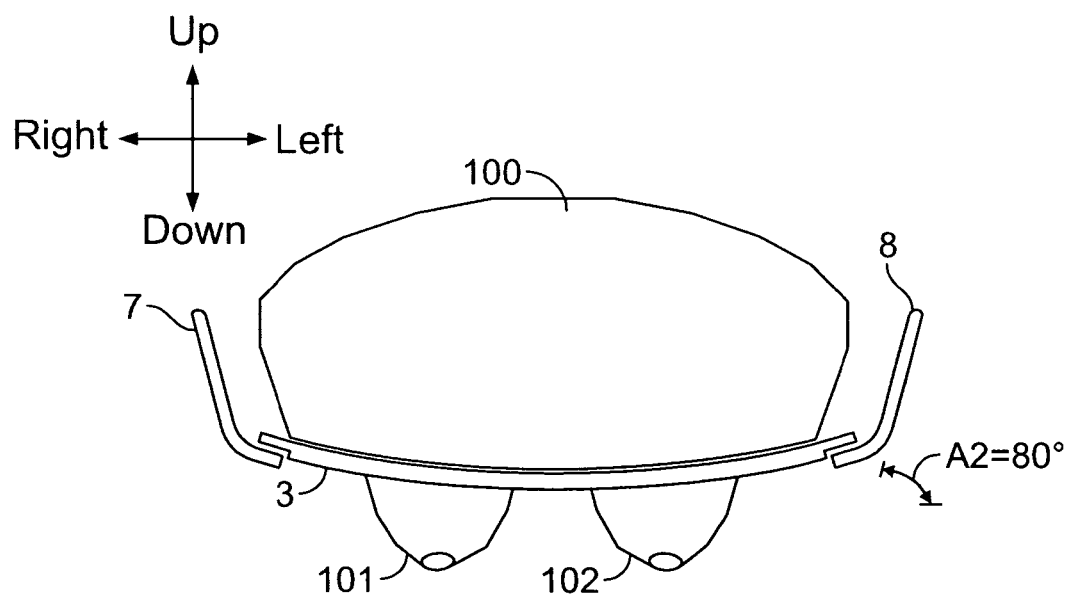
FIG. 6 is a front elevation view of the top coil portion of the MRI array coil system of FIG. 1 showing a body therein.
Figure 7:
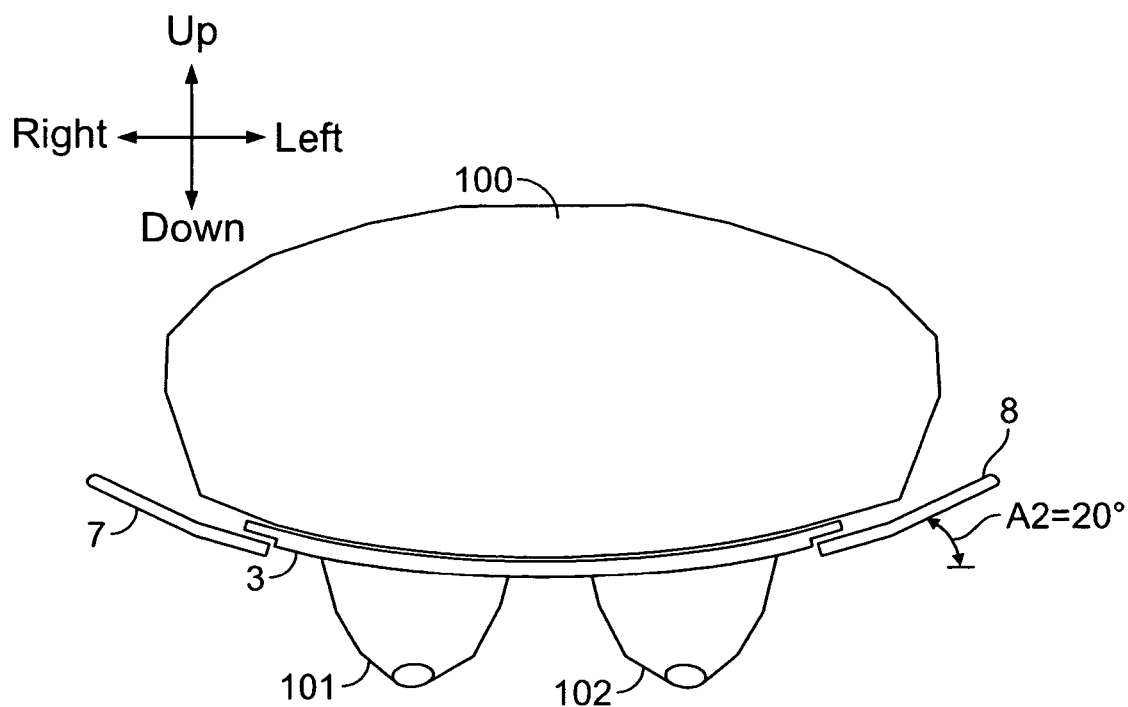
FIG. 7 is a front elevation view of a top coil portion of an MRI array coil system in accordance with another embodiment of the invention.

The shape of the cross-section of the main coil chamber 2 may be semi-elliptical, as shown in FIG. 4. In one embodiment, the main coil chamber 2 has a long-axis D1 of about 15 cm to about 25 cm along the superior-inferior direction and a short-axis D2 of about 7 cm to about 15 cm along the up-down direction. The patient contact surface of the top coil plate 3 or the top coil former 5 may be curved or flat. The shape of the top coil plate 3, as shown in FIG. 5, and in one embodiment, may be defined by a length B1 of about 28 cm to about 36 cm and a height B3 of about 0 cm to about 5 cm or by the length B1 and an angle A1 of about zero degrees to about twenty degrees formed between a tangential line at a region close to an end of the top coil former 5 and a horizontal line. The shape and the position of the two wings 7 and 8 may be defined, as shown in FIG. 5, by a distance B2 of about 5 cm to about 15 cm between a top edge and a horizontal line and an angle A2 of about twenty degrees and about eighty degrees between a tangential line along a side of a wing 7 or 8 and a horizontal line. FIGS. 6 and 7 illustrate, respectively, a top coil plate 3 with A2 being about eighty degrees for example, for a small size patient, and A2 being about twenty degrees for example, for a large size patient. The wings 7 and 8 may be provided on flexible or semi-flexible formers so that their shapes and positions can be adjusted, for example, by a user, based on a patient's size and body profile.

Figure 8:
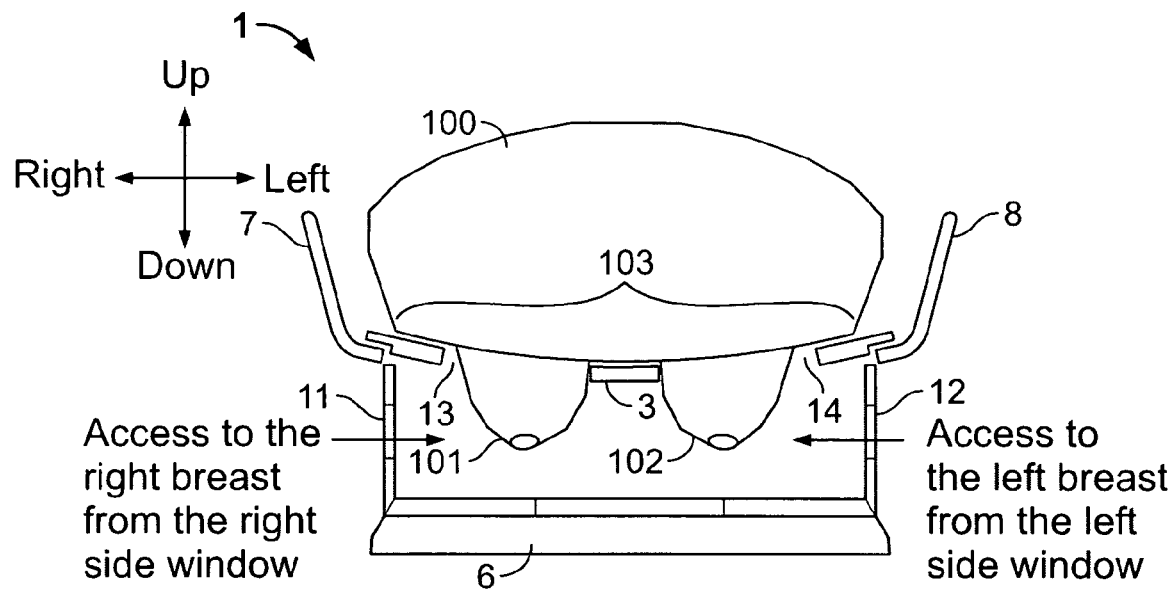
FIG. 8 is a front elevation view of the MRI array coil system of FIG. 1 showing a torso therein.

FIG. 8 shows a patient positioned in the MRI array coil system 1 with lateral access to the breasts of a patient thereby provided. A patient lies face downward (i.e., prone) on the MRI array coil system 1, which provides support to the patient's torso 100, with a chest 103 of the patient torso 100 contacting or touching the top coil plate 3. It should be noted that the superior direction is out of the plane of the FIG. 8 and the inferior direction is into the plane of FIG. 8. The right and left openings 13 and 14 on the top coil plate 3 receive the right and left breasts 101 and 102 of the patient torso 100 and the breasts 101 and 102 enter the main coil chamber 2. The right breast 101 of the patient is accessible from the right window 11 as illustrated in FIG. 8 by the arrow through the right window 11. The left breast 102 of the patient is accessible from the left window 12 as illustrated in FIG. 8 by the arrow through the left window 12.

Figure 9:
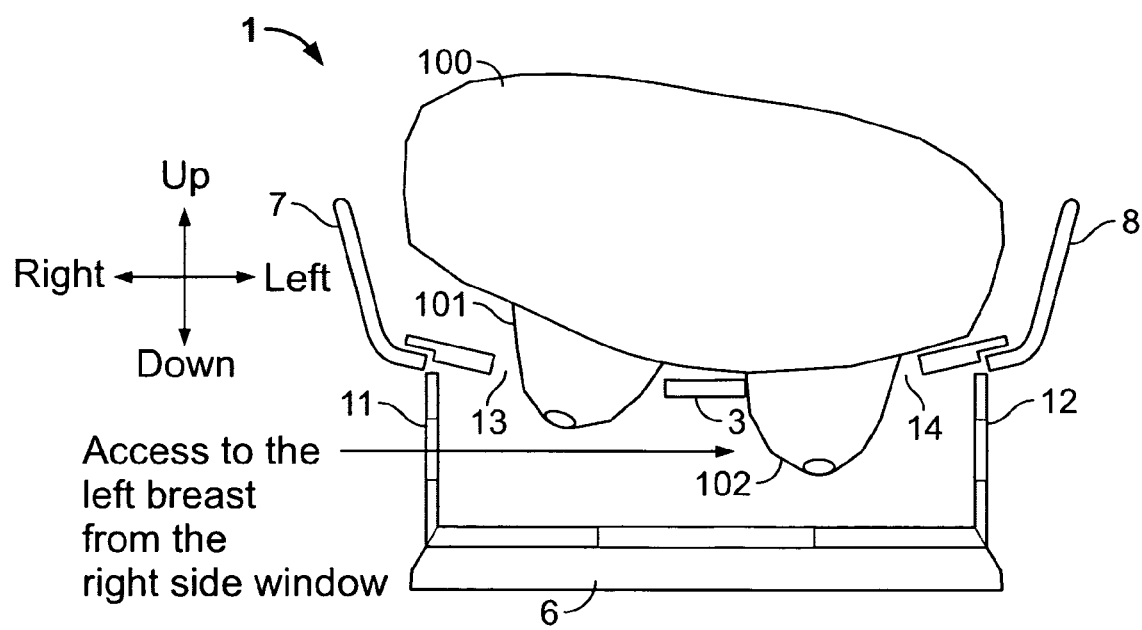
FIG. 9 is a front elevation view of the MRI array coil system of FIG. 1 showing access from a side window in accordance with one embodiment of the invention.
Figure 10:
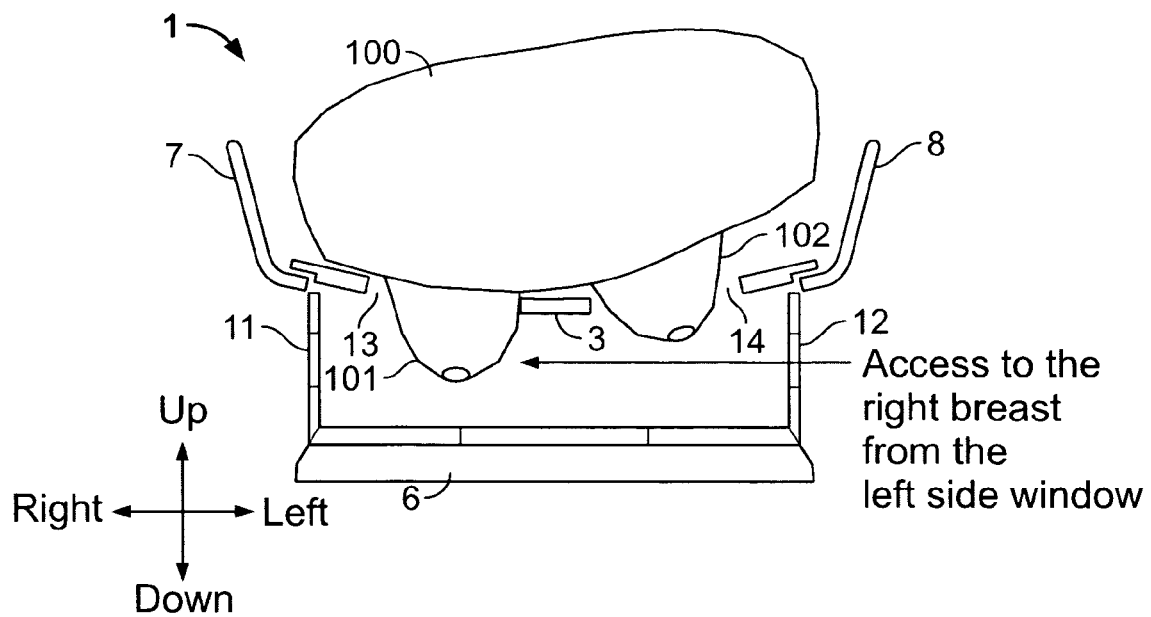
FIG. 10 is a side elevation view of the MRI array coil system of FIG. 1 showing access from another window in accordance with an embodiment of the invention.

FIGS. 9 and 10 illustrate medial access to the breasts of a patient. In FIG. 9, the right portion of the patient's torso 100 and the right breast 101 are elevated to a suitable height to allow the left breast 102 of the patient to be accessed from the right window 11. In FIG. 10, the left portion of the patient's torso 100 and the left breast 102 are elevated to a suitable height to allow the right breast 101 of the patient to be accessed from the left window 12.

Figure 11:
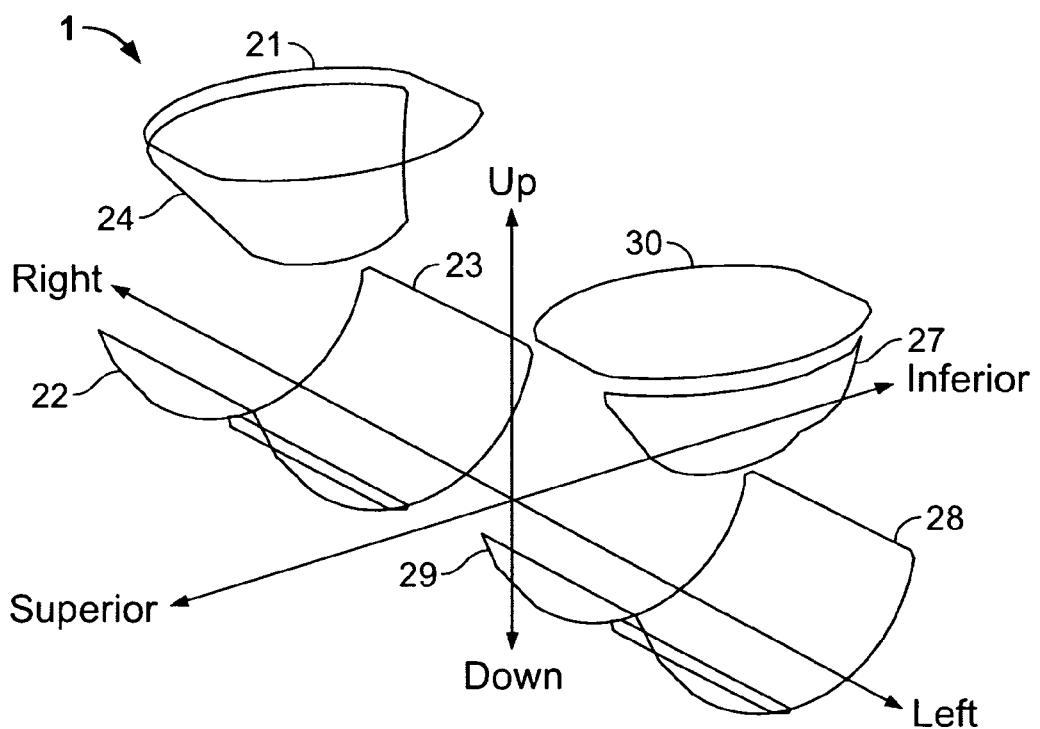
FIG. 11 is a schematic diagram of the MRI array coil system of FIG. 1.
Figure 12:
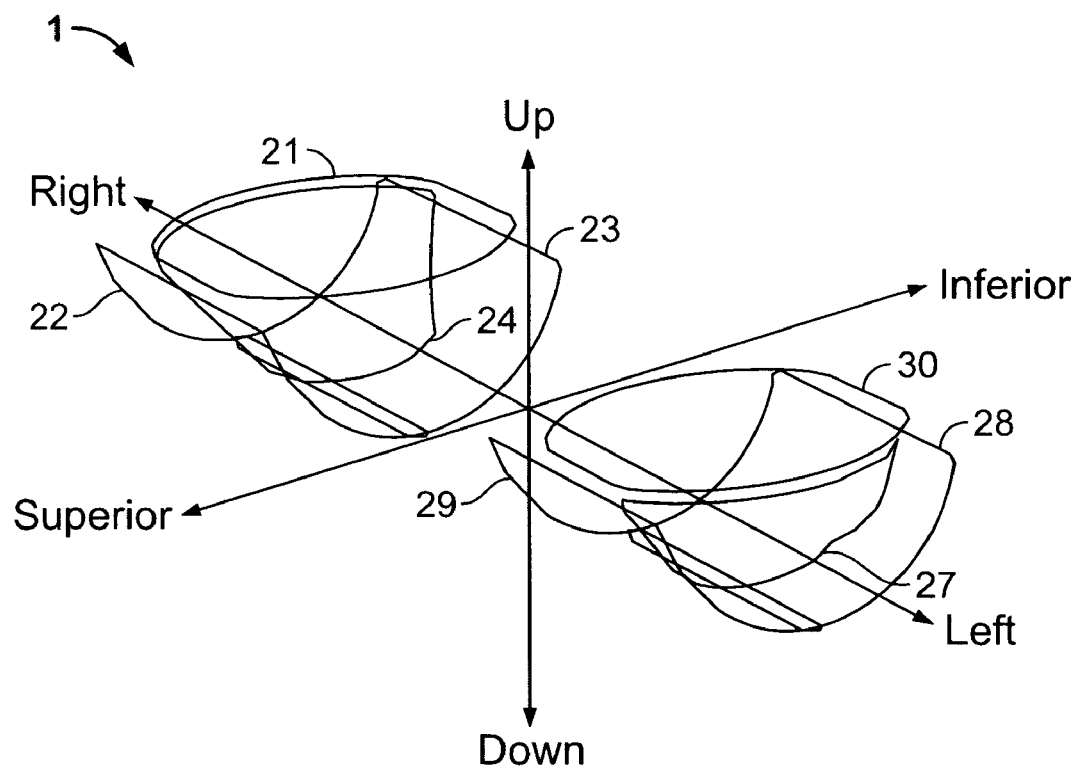
FIG. 12 is another schematic diagram of the MRI array coil system of FIG. 1.

The electrical arrangement of the coil elements of the MRI array coil system 1 of various embodiments of the present invention include at least eight coil elements (e.g., RF coil elements). FIGS. 11 and 12 show an eight-element MRI array coil system 1 in accordance with one embodiment that includes four loop coils 21, 22, 23 and 24 for right breast imaging and four loop coils 30, 27, 28 and 29 for left breast imaging. FIG. 11 shows the eight coil elements separated for ease in illustrating and FIG. 12 shows the eight coil elements in an operational position. Loop coils 21 and 30 are provided, respectively, around the right and left openings 13 and 14 (shown in FIGS. 1 and 2) of the top coil plate 3 (shown in FIGS. 1 and 2) for imaging the right breast 101, left breast 102 and chest 103 of a human. Loop coils 24 and 27 are provided, respectively, around the right and left windows 11 and 12 (shown in FIGS. 1 and 2) of the main coil chamber 2 (shown in FIGS. 1 and 2) to provide lateral coverage for the right and left breasts 101 and 102. Loop coils 22 and 23 are provided in the superior-inferior direction on the bottom coil former 4 to receive signals mainly from the lower portion of right breast 101. Loop coils 28 and 29 are similarly provided in the superior-inferior direction on the bottom coil former 4 to receive signals mainly from the lower portion of left breast.

In operation, the four loop coils for right breast 21, 22, 23 and 24 distribute in all the three directions (i.e., left-right, superior-inferior and up-down directions). The four loop coils for left breast 27, 28 29 and 30 also distribute in all three directions. This arrangement allow the four coil elements around a breast to provide sensitivity encoding capability in all three directions for the breast and allow, for example, 3D SENSE imaging for unilateral breast imaging. SENSE imaging efficiency is the same in both the superior-inferior and up-down directions for bilateral breast imaging as that for unilateral breast imaging. In the bilateral imaging mode, SENSE imaging efficiency in the left-right direction is higher than in unilateral imaging mode.

Figure 13:
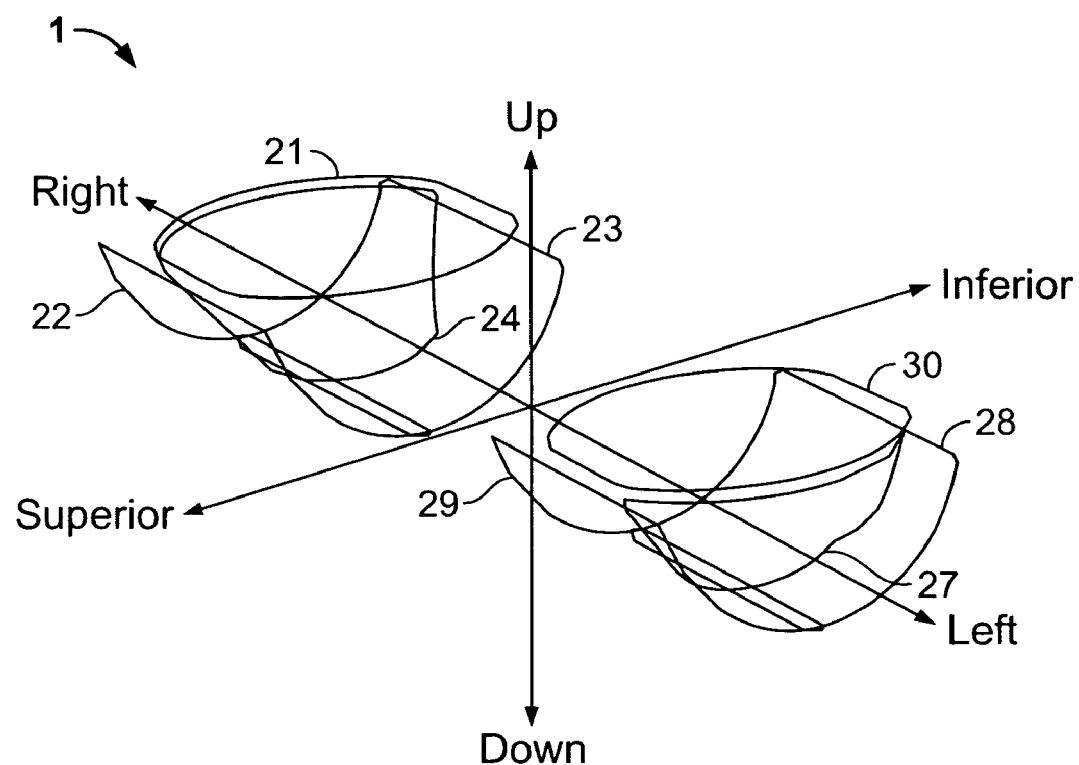
FIG. 13 is a schematic diagram of another embodiment of the MRI array coil system of FIG. 1.
Figure 14:
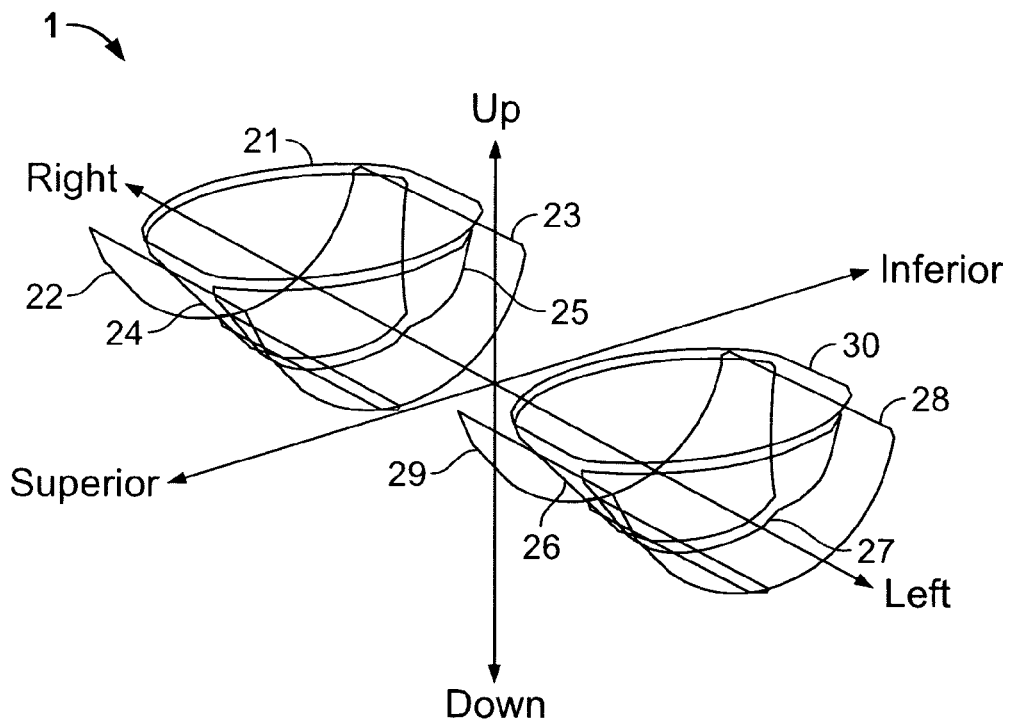
FIG. 14 is another schematic diagram of the MRI array coil system of FIG. 13.

In other embodiments as shown in FIGS. 13 and 14, two lateral loop coils 25 and 27 for imaging the right breast and left breast, respectively, may be provided. The MRI array coil system 1 in these embodiments are a ten-element design. FIG. 14 shows the coil elements in their operational positions.

Figure 15:
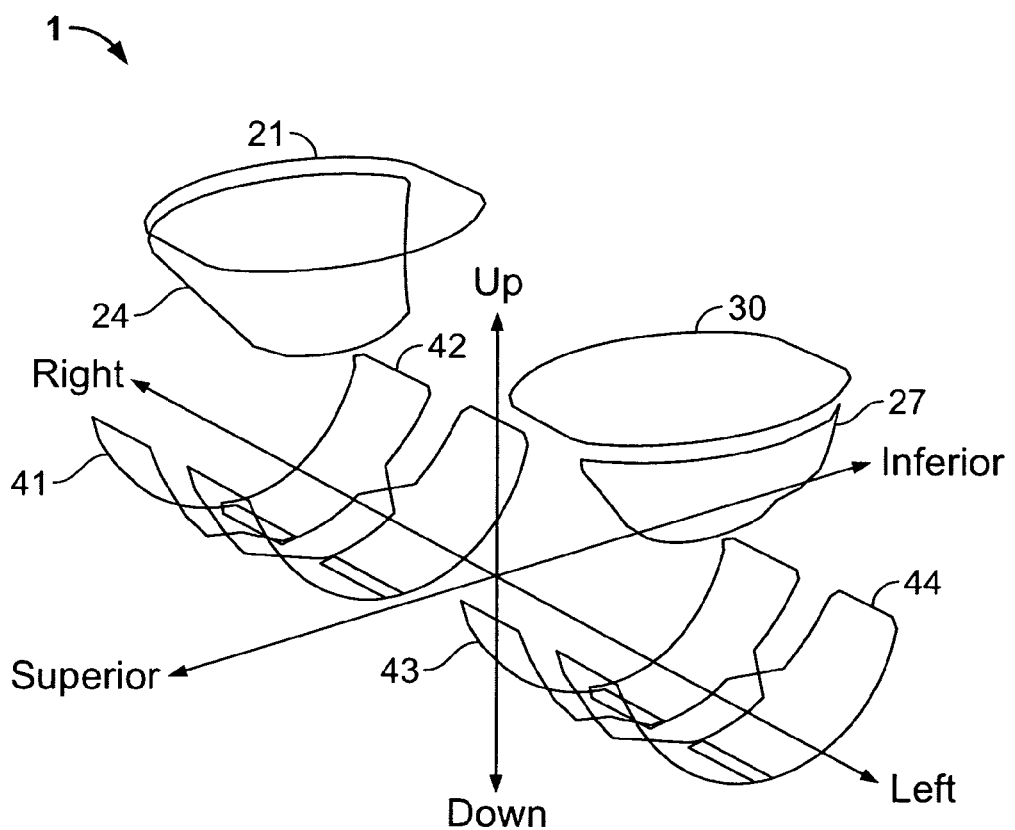
FIG. 15 is a schematic diagram of another embodiment of the MRI array coil system of FIG. 1.
Figure 16:
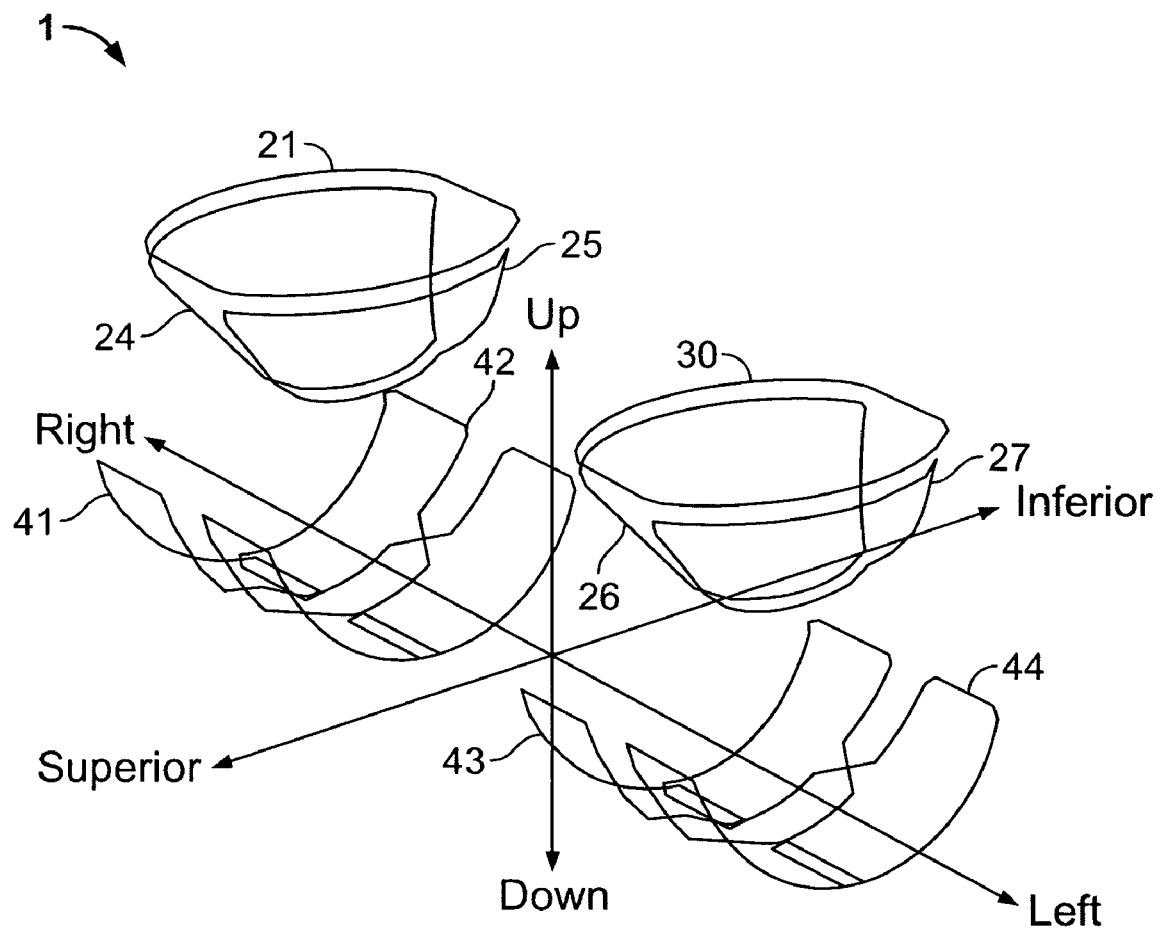
FIG. 16 is a schematic diagram of another embodiment of the MRI array coil system of FIG. 1.
Figure 17:
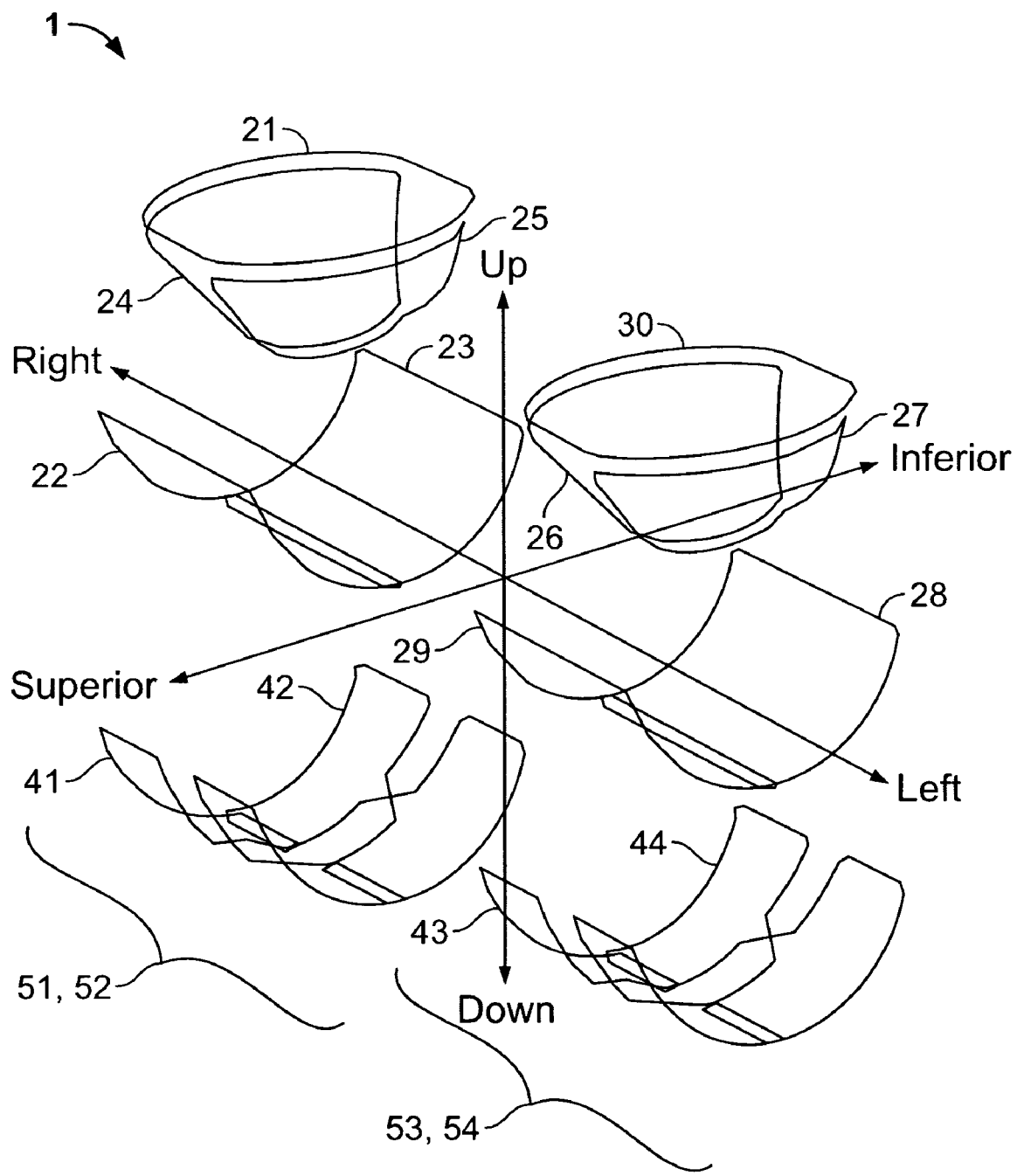
FIG. 17 is a schematic diagram of another embodiment of the MRI array coil system of FIG. 1.

In another embodiment, the four loop coils 22, 23, 29 and 28 on the bottom coil former 4 of the eight-element design shown in FIGS. 11 and 12 may be replaced by four saddle coils 41, 42, 43 and 44, as shown in FIG. 15. Similarly, the four loop coils 22, 23, 29 and 28 on the bottom coil former 4 of the ten-element design as shown in FIGS. 13 and 14 also may be replaced by four saddle coils 41, 42, 43 and 44, as shown in FIG. 16. Further, the four saddle coils 41, 42, 43 and 44 may be added to the ten-element design to form four quadrature (QD) pairs 51, 52, 53 and 54 with the four loop coils 22, 23, 29 and 28 as shown in FIG. 17. The MRI array coil system 1 in this embodiment is a fourteen-element design.

Figure 18:
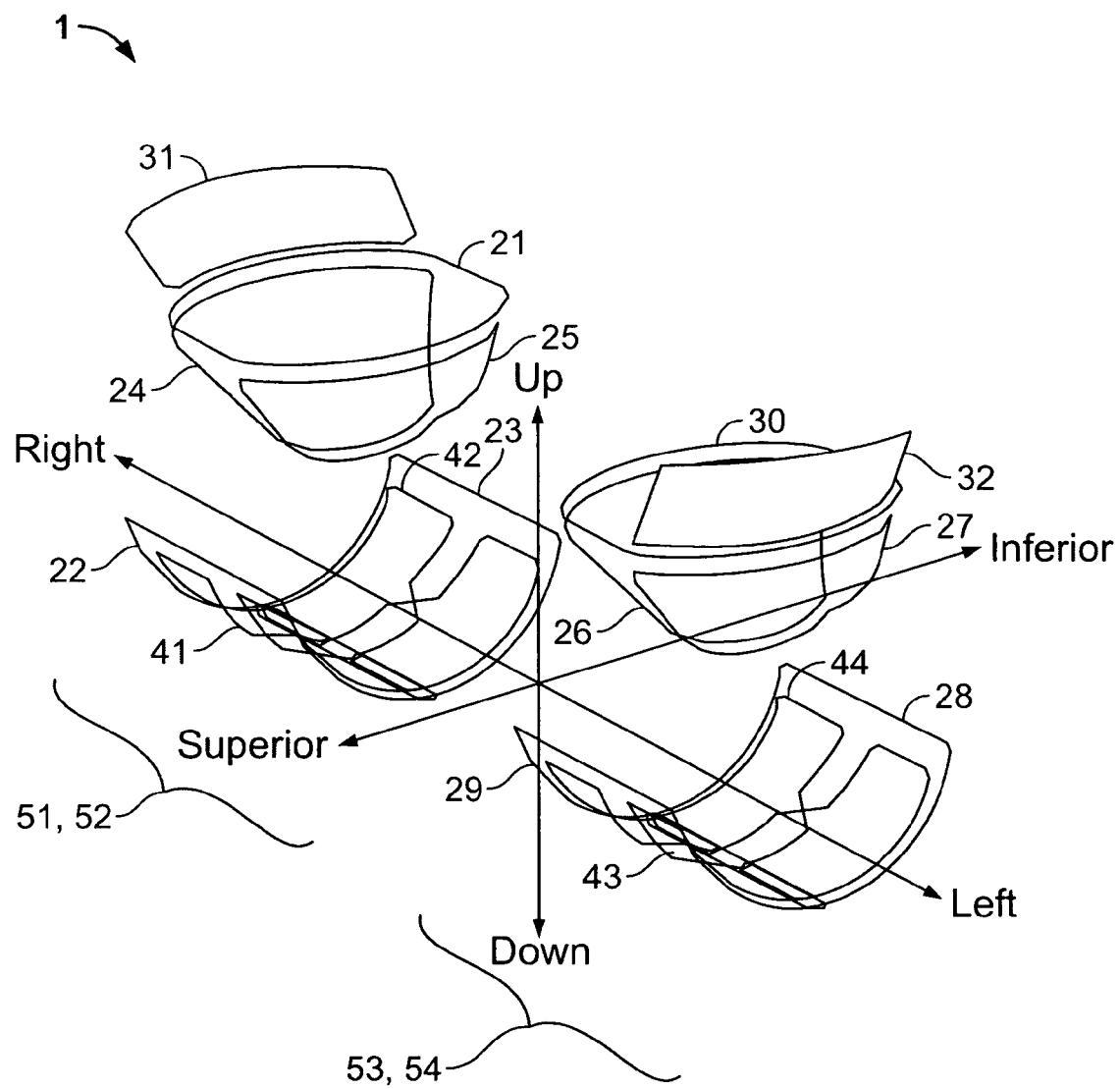
FIG. 18 is a schematic diagram of another embodiment of the MRI array coil system of FIG. 1.

Two loop coils 31 and 32 may be provided to this fourteen-element design for the two wings 7 and 8, as shown in FIG. 18, and which improves SNR and SENSE imaging efficiency in the left-right direction for chest region imaging. The MRI array coil system 1 in this embodiment is a sixteen-element design.

Figure 19:
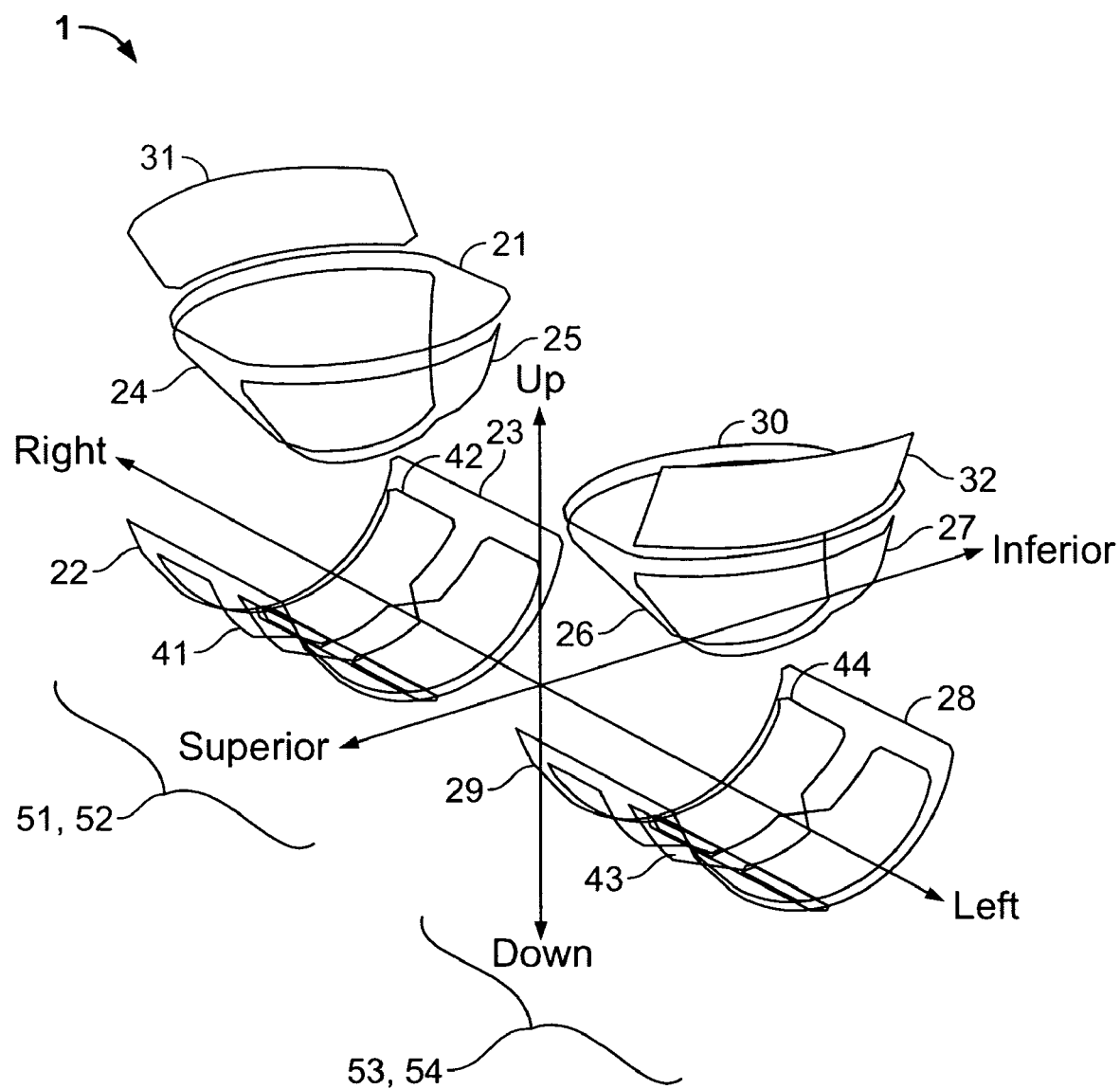
FIG. 19 is a schematic diagram of another embodiment of the MRI array coil system of FIG. 1.

Fours loop coils 33, 34, 35 and 36 may be provided to fourteen-element design, as shown in FIG. 19, and improves SNR and SENSE imaging efficiency in the superior-inferior direction for chest region. As shown in FIG. 19, loop coils 33 and 34 are for right breast 101 and loop coils 35 and 36 are for left breast 102. The MRI array coil system 1 in this embodiment is an eighteen-element design.

Figure 20:
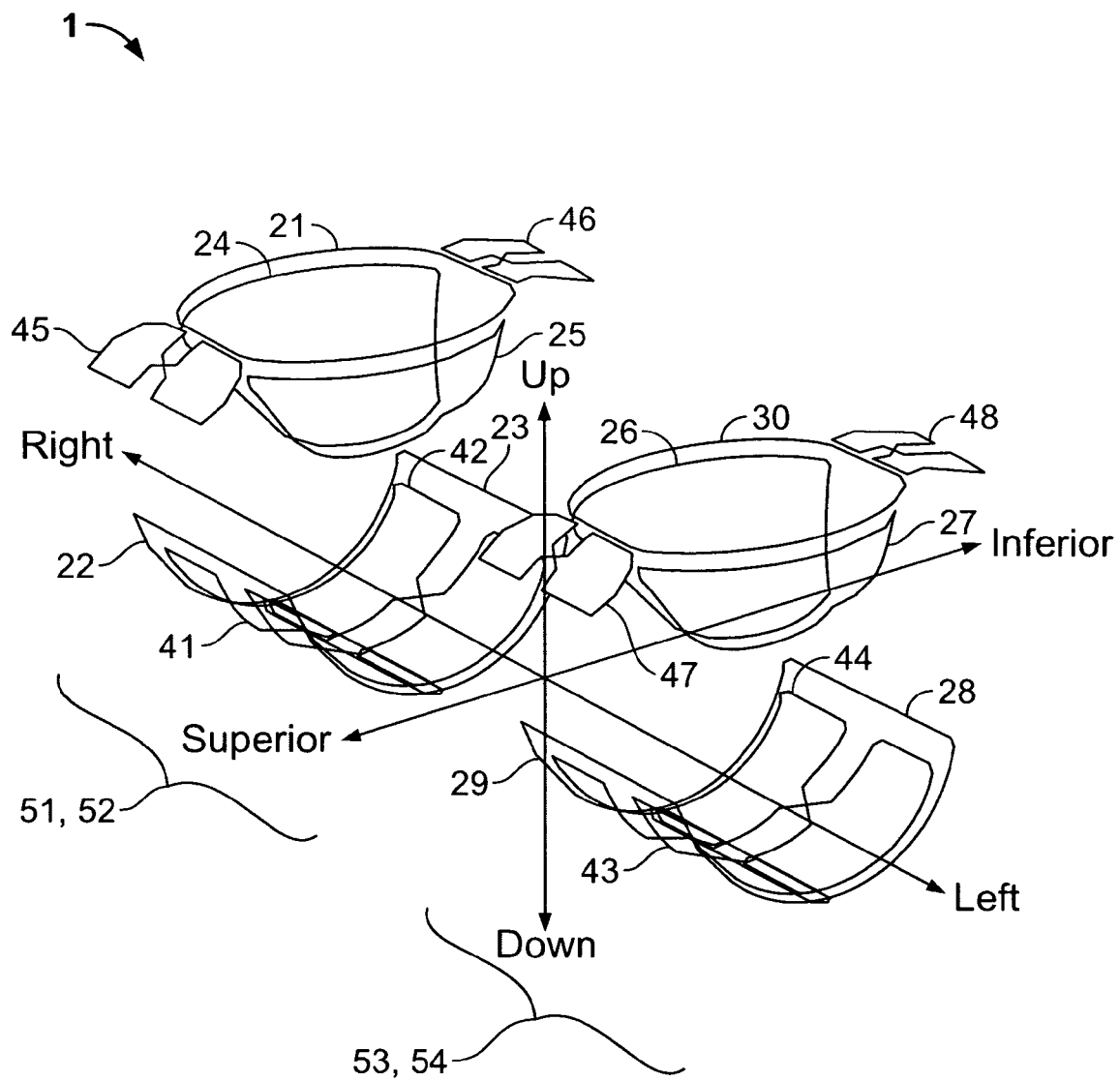
FIG. 20. A schematic diagram of another embodiment of the MRI array coil system of FIG. 1.
Figure 21:
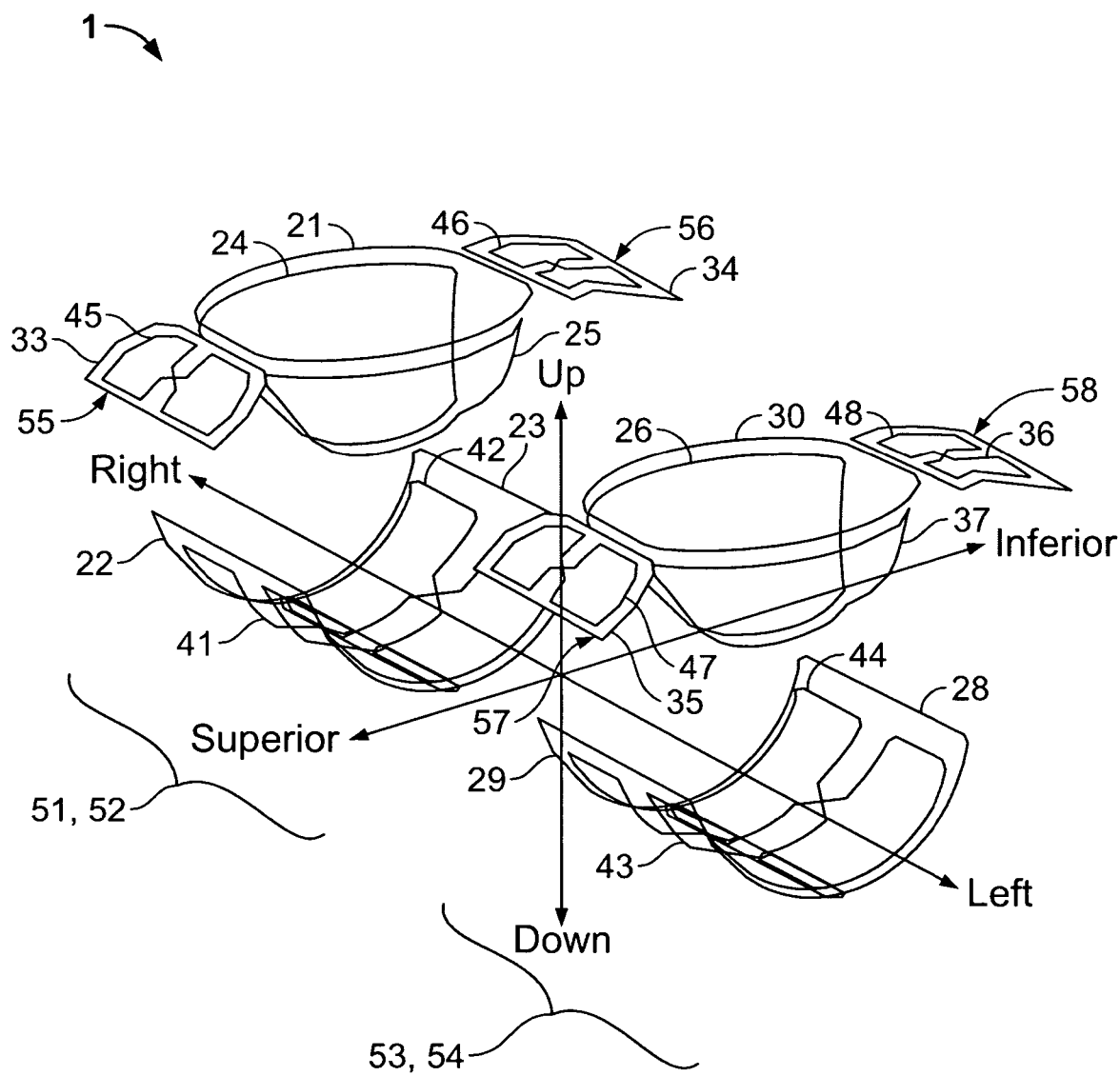
FIG. 21 is a schematic diagram of another embodiment of the MRI array coil system of FIG. 1.
Figure 22:
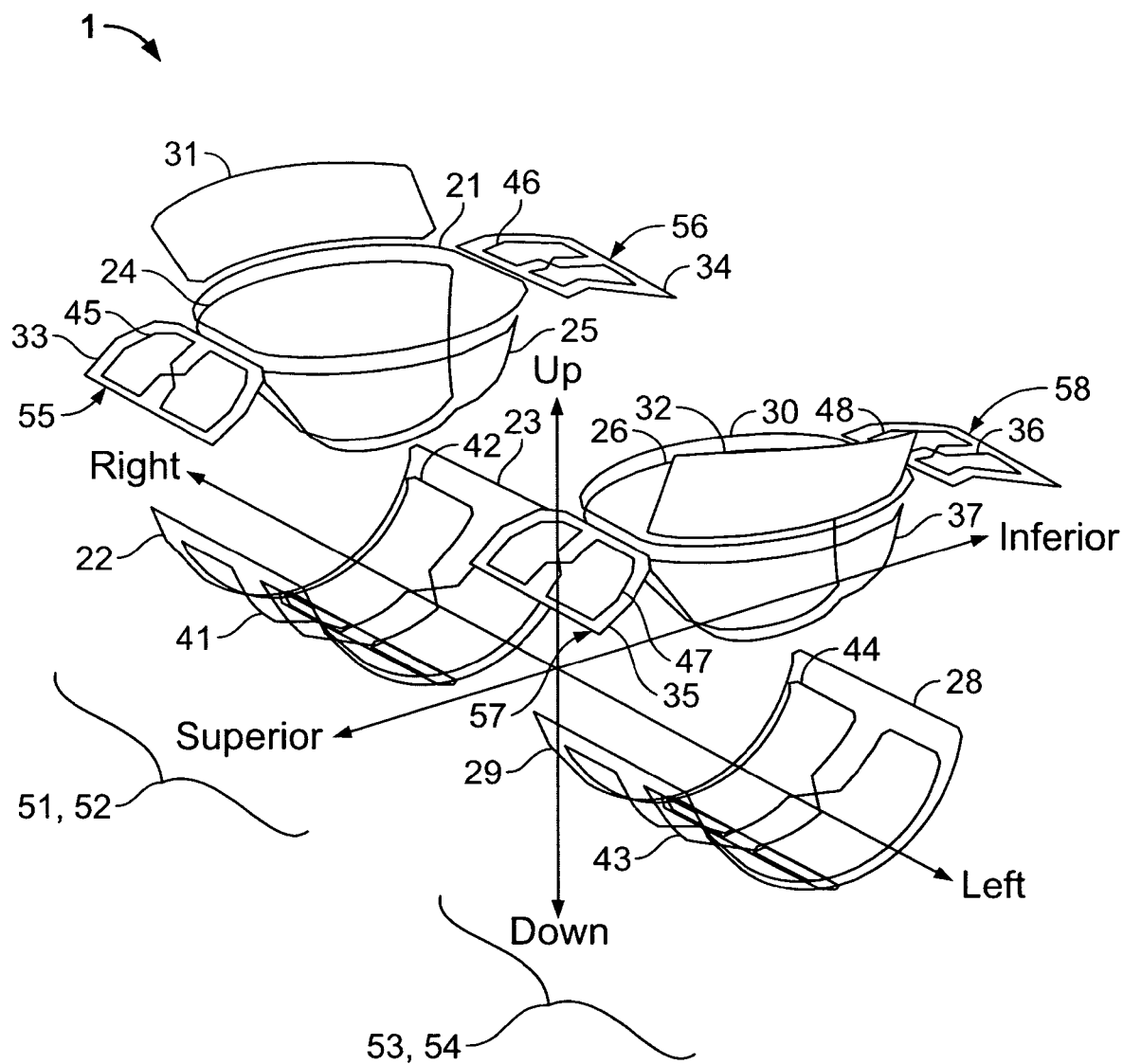
FIG. 22 is a schematic diagram of the another embodiment of the MRI array coil system of FIG. 1.

The four loop coils 33, 34, 35 and 36 in the eighteen-element design may be replaced by four saddle coils 45, 46, 47 and 48 as shown in FIG. 20. Further, the four saddle coils 45, 46, 47 and 48 may be added to the eighteen-element design to form four quadrature (QD) pairs 55, 56, 57 and 58 with the four loop coils 33, 34, 35 and 36 as shown in FIG. 21. The MRI array coil system 1 in this embodiment is a twenty-two-element design. Loop coils 31 and 32 may also be added to this twenty-two-element design for the two wings 7 and 8, as shown in FIG. 22. The MRI array coil system 1 in this embodiment is a twenty-four-element design.

Figure 23:
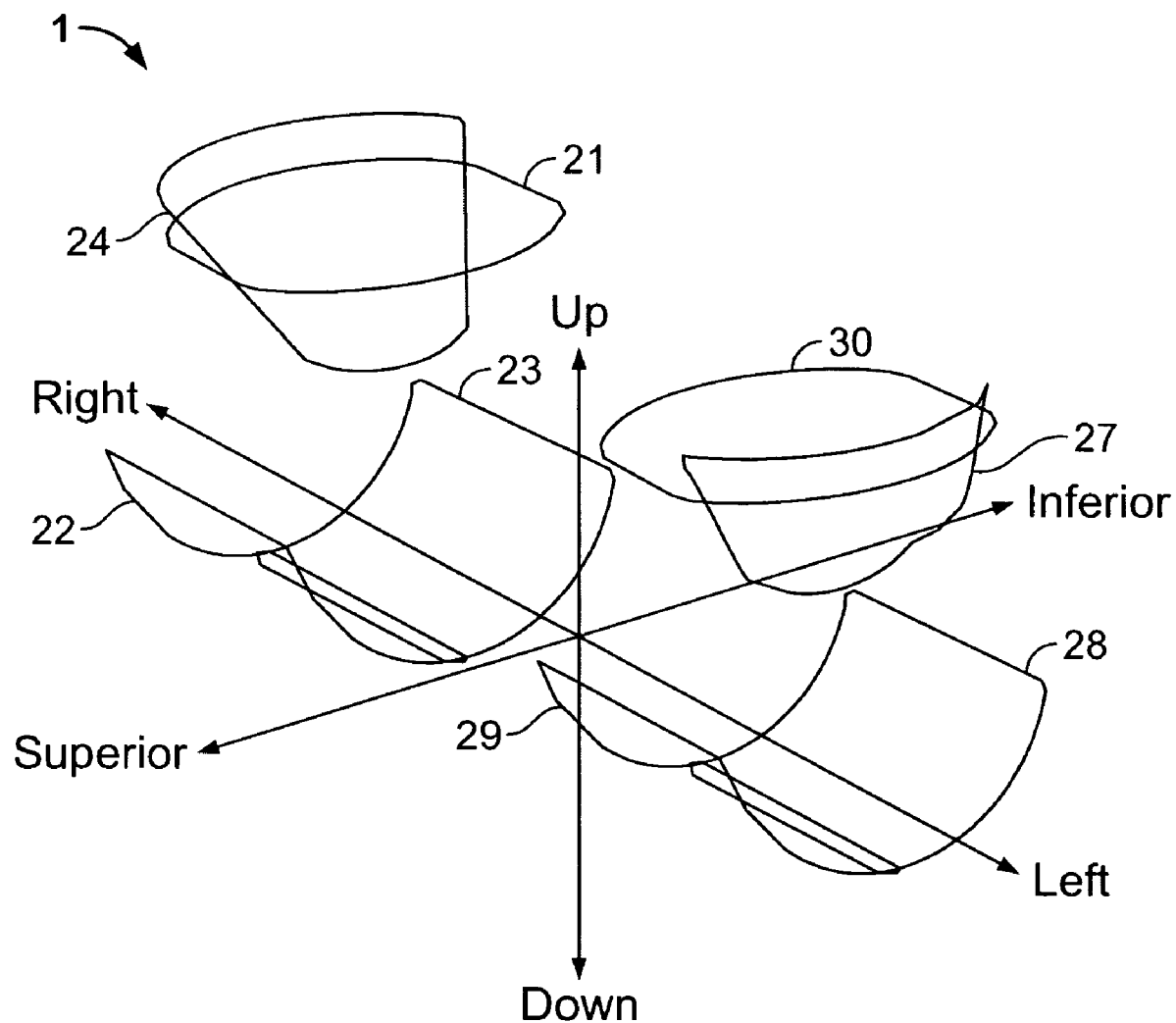
FIG. 23 is a schematic diagram of another embodiment of the MRI coil array system of FIG. 1.
Figure 24:
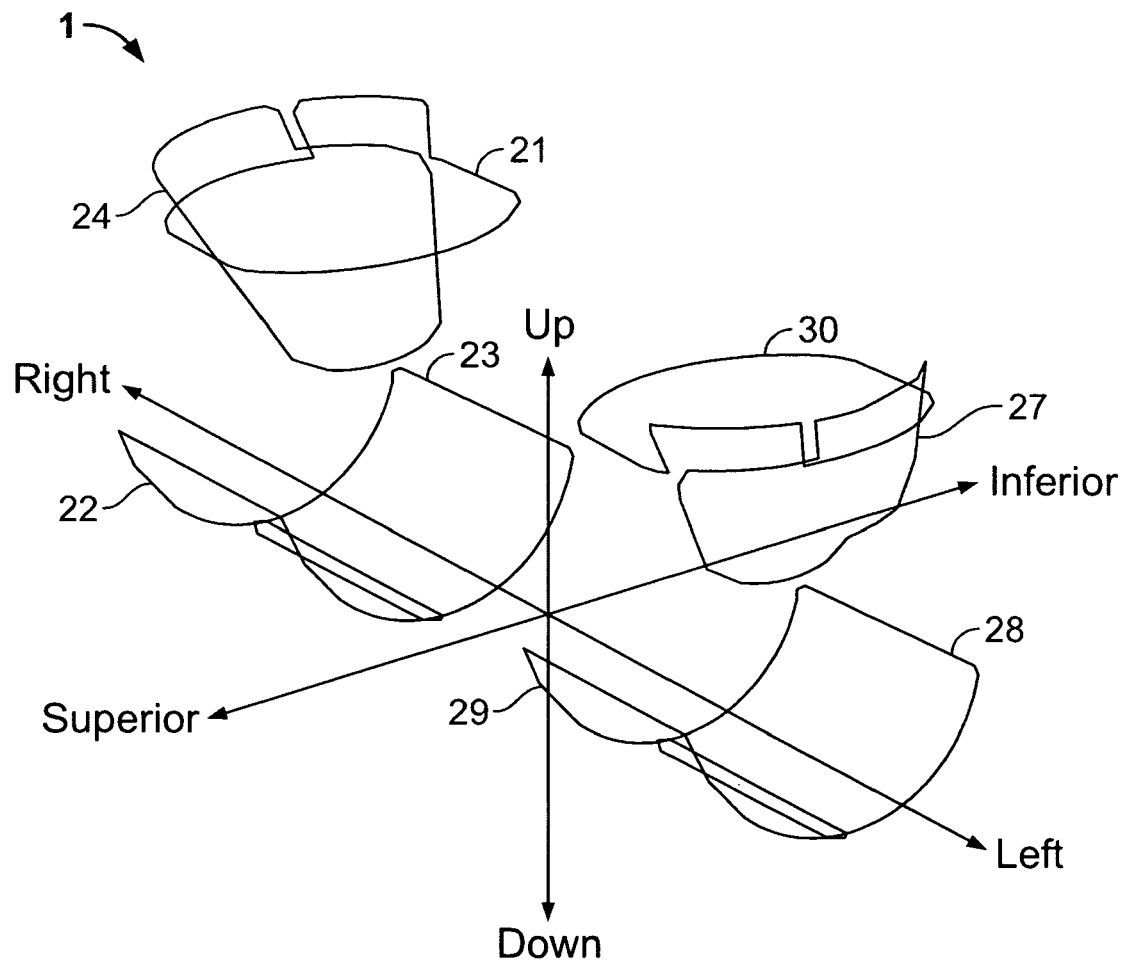
FIG. 24 is a schematic diagram of another embodiment of the MRI coil array system of FIG. 1.

In operation, depending on the type of imaging system in connection with which the MRI array coil system 1 is used, and the number of coils provided in the MRI array coil system 1, a MRI scanner having more than eight receivers, for example, a MRI scanner with a minimum of twenty-four receivers may be needed for the MRI array coil system 1 of the twenty-four-element design. For example, for a eight-receiver MRI scanner, the eight-element design as shown in FIG. 12 may be used. However, with other embodiments having more than eight elements, an MRI scanner having more receivers or channels may be needed Further, modifications may be provided to MRI array coil system 1, for example, in order to improve the SNR and SENSE imaging efficiency in the left-right direction for chest region for the eight-element design. For example, the two lateral loop coils 24 and 27 may be extended upwards to form the two wings 7 and 8, respectively, as shown in FIG. 23. The circuitry of the right wing 7, shown in FIG. 24, may be formed partially (e.g., about one-half) by the right lateral loop 24 and partially (e.g., about one-half) by the right chest loop 21. The circuitry of the left wing 8, shown in FIG. 24, also may be formed partially (e.g., about one-half) by the left lateral loop 27 and partially (e.g., about one-half) by the left chest loop 30. These circuitry configurations of the wings of the MRI array coil system 1 of, for example, the eight-element design, further improve SENSE imaging efficiency in the superior-inferior direction for chest region imaging.

Thus, various embodiments of the present invention provide open ends, for example, the two windows 11 and 12 of the MRI array coil system 1 that allow access to one window from the other window through the main coil chamber. This provides lateral access to the breasts being imaged (e.g., accessing the right breast from the right window or accessing the left breast from the left window), thereby allowing for lateral breast biopsy applications. Further, medial access to the breasts being imaged (e.g., accessing the right breast from the left window or accessing the left breast from the right window) also is provided with the MRI array coil system 1.

The curved patient contact surface of the top coil plate 3 and flexible wings 7 and 8 of the MRI array coil system 1 accommodates various body profiles of patients, thus providing a more patient friendly design.

The semi-elliptical shaped cross-section of the bottom coil former 4 of the main coil chamber 2 allows the coil elements that are provided on the bottom coil former 4 to be closer to the imaged objects (e.g., breasts of a human), and to provide better SNR and coverage.

The MRI array coil system 1 also may provide eight to twenty-four coil elements (e.g., channels), to allow use in connection with an MRI scanner having eight or higher numbers of receivers. It should be noted that the coil elements are isolated from each other through geometric isolation and/or preamplifier decoupling and/or using transformers. Therefore, all the coil elements of the MRI array coil system 1 may be used simultaneously to provide imaging on a multi-channel MRI scanner.

The MRI array coil system 1 further provides two separate sets of coil elements: one set for the right breast and the other set for the left breast. Each set of coil elements can be used separately to achieve unilateral imaging for one of the two breasts of a patient. When both sets of coil elements are used, bilateral imaging for both the breasts of a patient can be obtained. The coil elements around each breast distribute in all the three directions (i.e., left-right, superior-inferior and up-down directions). These arrangements provide sensitivity encoding capability in all the three directions for the breast and allow for 3D SENSE unilateral breast imaging. Higher SENSE imaging efficiency in the left-right direction may be provided when both sets of coil elements are used for the bilateral imaging mode.

The two wings 7 and 8 of the MRI array coil system 1 also provide improved coverage for the chest wall region of a patient. The two wings 7 and 8 allow the coil elements to further distribute in the left-right direction around the chest region of a patient and improve SENSE imaging efficiency in the left-right direction for chest region. In addition, the four loop coils 33, 34, 35 and 36, distributing in the superior-inferior direction around chest region, not only provide higher SNR and better coverage, but also enhance SENSE imaging efficiency in the superior-inferior direction for chest region.

The eight quadrature coil pairs 51, 52, 53, 54, 55, 56, 57 and 58, formed by the eight loop coils 22, 23, 29, 28, 33, 34, 35 and 36 and the eight saddle coils 41, 42, 43, 44, 45, 46, 47 and 48, provide higher SNR for the chest region by providing quadrature signal detection, and also provide improved SENSE imaging efficiency in the superior-inferior direction resulting from the additional information of the phase of the local sensitivity of each saddle coil.

Thus, a multiple channel MRI array coil system that can be used on a MRI scanner equipped with eight or higher numbers of receivers for both unilateral and bilateral breast imaging is provided. Lateral biopsy access is provided such that the left breast of a patient can be accessed from the left open end of the imaging chamber and the right breast of the patient can be accessed from the right open end of the imaging chamber. Medial biopsy access also is provided such that a patient's left breast can be accessed from the right open end of the imaging chamber, and the right breast can be accessed from the left open end of the imaging chamber.

The MRI array coil system 1 also further provides sensitivity encoding in all three, x, y, and z, directions and for both the unilateral and bilateral imaging modes. Coil elements are distributed in the left-right, superior-inferior and up-down directions for both left and right breasts such that 3D SENSE imaging can be performed in all the three directions for both breasts of a patient. Improved coverage for the chest wall and axilla regions of a patient is also provided.

Sensitivity encoding in all three, x, y, and z, directions for the chest wall regions is additionally provided. Thus, 3D SENSE imaging also may be performed for the chest wall regions.

While the invention has been described in terms of various specific embodiments, those skilled in the art will recognize that the invention can be practiced with modification within the spirit and scope of the claims.

What is claimed is:

1. An MRI array coil system comprising:
a top coil portion having two openings configured to receive therethrough objects to be imaged; and
a bottom coil portion having two openings configured to access from sides of the bottom coil portion the objects to be imaged, the top coil portion and bottom coil portion each having a plurality of coil elements configured to provide parallel imaging, and wherein the bottom coil portion is configured having a semi-elliptical cross-section such that the two side openings of the bottom coil portion are semi-elliptical.

2. An MRI array coil system in accordance with claim 1 wherein the top coil portion is fixedly connected to the bottom coil portion.

3. An MRI array coil system in accordance with claim 1 wherein the top coil portion is removably connected to the bottom coil portion.

4. An MRI array coil system in accordance with claim 1 further comprising a wing portion connected to each of an end of the top coil portion.

5. An MIRI array coil system in accordance with claim 4 further comprising two loop coils forming the two wing portions.

6. An MIRI array coil system in accordance with claim 5 wherein one loop coil is a left lateral loop coil extending upward from the top coil section to form a left wing portion for a left coil section and another loop coil is a right lateral loop coil extending upward from the top coil section to form a right wing portion for a right coil section.

7. An MRI array coil system in accordance with claim 5 wherein the left wing portion further comprises a left chest loop coil and the right wing portion further comprises a right chest loop coil.

8. An MRI array coil system in accordance with claim 1 wherein a top of the top coil portion having the two openings is configured having a curved shape.

9. An MRI array coil system in accordance with claim 1 wherein a top of the top coil portion having the two openings is configured having a substantially flat shape.

10. An MRI array coil system in accordance with claim 1 wherein the top coil portion and bottom coil portion are configured to form an imaging chamber providing lateral access and medial access to the objects.

11. An MRI array coil system in accordance with claim 1 wherein the top coil portion and bottom coil portion are configured to provide coil elements that distribute in each of an x, y and z direction.

12. An MRI array coil system in accordance with claim 1 wherein the top coil portion and bottom coil portion are configured to form an imaging chamber to receive therein human breasts.

13. An MRI array coil system in accordance with claim 1 wherein the openings of the top coil section are arranged on left and right sides of a middle axis of the top coil portion.

14. An MRI array coil system in accordance with claim 1 wherein the plurality of coil elements comprise four loop coils defining a left coil section and four loop coils defining a right coil section.

15. An MRI array coil system in accordance with claim 14 further comprising two loop coils, one loop coil being positioned on the left side adjacent a middle of the bottom coil section and the second loop coil being positioned on the right side adjacent the middle of the bottom coil section.

16. An MRI array coil system in accordance with claim 14 wherein one loop coil of the left coil section being positioned around a left opening in the top coil section, a second loop coil of the left coil section being positioned around a left opening of the bottom coil section, a third and fourth loop coils being positioned in a superior-inferior direction on a left side of the bottom coil section, one loop coil of the right coil section being positioned around a right opening in the top coil section, a second loop coil of the right coil section being positioned around a right opening of the bottom coil section, and a third and fourth loop coils being positioned in a superior-inferior direction on a right side of the bottom coil section.

17. An MRI array coil system in accordance with claim 16 further comprising four saddle coils, two being positioned in the left coil section and two being positioned in the right coil section, the two saddle coils in the left coil section arranged in a superior-inferior direction on a left side of the bottom coil section and forming two quadrature coil pairs with the two left loop coils of the bottom coil section, the two saddle coils of the right coil section arranged in a superior-inferior direction on the right side of the bottom coil section and forming two quadrature coil pairs with the two right loop coils of the bottom coil section.

18. An MRI array coil system in accordance with claim 16 further comprising four loop coils positioned on the top coil portion, two for the left coil section and two for the right coil section, one of the two loop coils of the left coil section being positioned at a superior side of the top coil portion and a second loop coil of the left coil section being positioned at an inferior side of the top coil portion, one of the two loop coils of the right coil section being positioned at a superior side of the top coil portion and a second loop coil of the right coil section being positioned at an inferior side of the top coil portion.

19. An MRI array coil system in accordance with claim 16 further comprising four saddle coils being positioned on the top coil portion, two for the left coil section and the two of the right coil section, one of the two saddle coils for the left coil section being positioned at a superior side of the top coil portion and a second saddle coil of the left coil section being positioned at an inferior side of the top coil portion, one of the two saddle coils of the right coil section being positioned at a superior side of the top coil portion and a second saddle coil of the right coil being positioned at an inferior side of the top coil portion.

20. An MRI array coil system in accordance with claim 16 further comprising four loop coils and four saddle coils forming four quadrature coil pairs and being positioned on the top coil portion, two quadrature coil pairs for the left coil section and two quadrature coil pairs for the right coil section, one of the two quadrature coil pairs of the left coil section being positioned at an superior side of the top coil portion and a second quadrature coil pair of the left coil section being positioned at an inferior side of the top coil portion, one of the two quadrature coil pairs of the right coil section being positioned at a superior side of the top coil portion and a second quadrature coil pair of the right coil section being positioned at an inferior side of the top coil portion.

21. An MRI array coil system in accordance with claim 1 wherein the plurality of coil elements comprise four loop coils and four saddle coils, two loop coils and two saddle coils defining a left coil section and two loop coils and two saddle coils defining a right coil section.

22. An MRI array coil system in accordance with claim 21 wherein a first loop coil of the left coil section being positioned around a left opening in the top coil section, a second loop coil of the left coil section being positioned around a left opening in the bottom coil section, and the two saddle coils of the left coil section being positioned in the superior-inferior direction on a left side of the bottom coil section, a first loop coil of the right coil section being positioned around a right opening in the top coil section, a second loop coil of the right coil section being positioned around a right opening in the bottom coil section, and the two saddle coils of the right coil section being positioned in the superior-inferior direction on a right side of the bottom coil section.

23. An MRI array coil system for imaging breasts, said MRI array coil system comprising:
  a top coil portion having two openings configured to receive therethrough breasts to be imaged and having one of a curved top surface and a substantially flat top surface;
  a bottom coil portion having two openings configured to access from sides of the bottom coil portion the breasts to be imaged, the top coil portion and bottom coil portion each having a plurality of coil elements configured to provide parallel imaging and together forming an imaging chamber to receive therein the breasts and to provide lateral and medial access to the breasts; and
  two wing portions provided on separate formers, the formers being one of rigid and semi-flexible.

24. An MRI array coil system in accordance with claim 23 further comprising a main bottom coil housing supporting the top coil portion.

25. An MM array coil system in accordance with claim 24 wherein the bottom coil portion is one of fixedly and removably connected to the main bottom coil housing.

26. An MM array coil system in accordance with claim 23 further comprising two wing portions provided on separate formers, the formers being semi-flexible, and wherein the formers are configured to tilt at an angle between about twenty degrees and about eighty degrees relative to the top coil portion.

27. An MRI array coil system in accordance with claim 23 wherein the plurality of coil elements comprise at least eight coil elements.

28. An MRI array coil system in accordance with claim 23 wherein the plurality of coil elements comprise not more than twenty-four coil elements.

29. An MRI array coil system in accordance with claim 23 wherein the parallel imaging comprises SENSE imaging.

30. A method for magnetic resonance imaging, said method comprising:
  configuring openings in a top coil portion of a coil array to receive breasts therethrough; and
  providing at least one of lateral and medial access to the breasts through semi-elliptical openings of a bottom coil portion of the coil array, the top coil portion and bottom coil portion each having a plurality of coil elements configured to provide parallel imaging.

* * * * *